(12) United States Patent
Enache et al.

(10) Patent No.: US 10,707,872 B1
(45) Date of Patent: Jul. 7, 2020

(54) DIGITAL BUFFER CIRCUIT

(71) Applicant: SEMICONDUCTOR COMPONENTS INDUSTRIES, LLC, Phoenix, AZ (US)

(72) Inventors: Andrei Enache, Bucharest (RO); Anca Mihaela Dragan, Mioveni (RO); Adrian Macarie Tache, Bucharest (RO)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/512,991

(22) Filed: Jul. 16, 2019

Related U.S. Application Data

(60) Provisional application No. 62/820,954, filed on Mar. 20, 2019.

(51) Int. Cl.
*H03K 19/0185* (2006.01)

(52) U.S. Cl.
CPC ............... *H03K 19/018521* (2013.01)

(58) Field of Classification Search
CPC ............................... H03K 19/018521
USPC ....................................... 326/80–83
See application file for complete search history.

(56) References Cited

U.S. PATENT DOCUMENTS

| | | | | |
|---|---|---|---|---|
| 6,320,361 B2 * | 11/2001 | Dima | ...................... | G05F 3/242 323/284 |
| 6,646,472 B1 * | 11/2003 | Trivedi | ...................... | G06F 1/10 326/119 |
| 6,677,797 B2 * | 1/2004 | Kameyama | ........ | H03K 19/0016 326/80 |
| 2001/0043094 A1 | 11/2001 | Clark et al. | | |
| 2003/0071656 A1 * | 4/2003 | Ogane | ...................... | G11C 8/08 326/81 |
| 2009/0189640 A1 * | 7/2009 | Seto | ............... | H03K 19/018521 326/81 |
| 2010/0231259 A1 * | 9/2010 | Jung | .............. | H03K 19/018521 326/81 |
| 2017/0278553 A1 | 9/2017 | Kojima | | |

\* cited by examiner

*Primary Examiner* — Don P Le
(74) *Attorney, Agent, or Firm* — Brake Hughes Bellermann LLP

(57) ABSTRACT

Circuits and techniques for buffering a digital signal are disclosed. The circuits and techniques allow a digital buffer circuit to accommodate a range of output voltages while maintaining a delay between input and output that is suitable for digital communications. The disclosed circuits and techniques utilize a combination of low voltage switches and high voltage switches. The low voltage switches dominate the buffering process when the buffer drives external circuitry (e.g., a communications bus) having a low voltage then, and the high voltage switches dominate the buffering process when the buffer drives external circuitry having a high voltage. The high voltage and low voltage switches configure themselves automatically based on an operating condition determined by the voltage level of the output with respect to the voltage level of the input.

20 Claims, 6 Drawing Sheets

DIGITAL BUFFER CIRCUIT

CROSS-REFERENCE TO RELATED APPLICATIONS

This application claims the benefit of U.S. Provisional Patent Application No. 62/820,954, filed on Mar. 20, 2019, the entire contents of which is incorporated herein by reference.

FIELD OF THE DISCLOSURE

The present disclosure relates to electronic circuits and more specifically to a high speed digital buffer circuit having a wide output voltage range.

BACKGROUND

In digital serial communication protocols, a maximum delay may be imposed between a clock edge and a data transition (i.e., switch). A digital buffer circuit, used for transitioning between two different voltage domains, may contribute significantly to the delay between a clock edge and a data transition. The digital buffer circuit includes an output stage with transistors for switching between an upper rail and a lower rail of an output voltage domain according to the data transitions of an input voltage domain. The transistors in an output stage are designed in accordance with a maximum output voltage that the digital buffer circuit is expected to experience. The switching speeds of these transistors are reduced; however, as the output voltage is lowered from this maximum voltage.

SUMMARY

Accordingly, in one general aspect, the present disclosure describes a buffer circuit including a plurality of stages that are each coupled to a high voltage (HV) supply and a low voltage (LV) supply. Each of the plurality of stages includes a push-pull circuit. The push-pull circuit includes a HV PMOS transistor that is controllable to pull-up an output of the stage to the HV supply when the buffer circuit is in a HV operating condition. The push-pull circuit also includes a LV PMOS transistor that is controllable to pull-up the output of the stage to the LV supply when the buffer circuit is in a LV operating condition.

In one possible implementation, the HV operating condition occurs when the LV supply provides a regulated voltage and the HV supply provides a voltage that is higher than the regulated voltage.

In one possible implementation, the LV operating condition occurs when the HV supply provides a voltage that is lower than the regulated voltage and the HV supply and the LV provide the same voltage.

In another general aspect, the disclosure describes a method for buffering a digital signal. In the method, a low voltage NMOS transistor is controlled to turn ON upon receiving a logical high signal. The low voltage NMOS transistor is coupled between an output and ground so that when it is turned ON the output is pulled-down to a ground. Upon receiving a logical low signal, a high voltage PMOS transistor, which is coupled between a high voltage supply and the output, is controlled to turn ON. Additionally a low voltage PMOS transistor, which is coupled between a low voltage supply and the output, is controlled to turn ON. When both the high voltage PMOS transistor and the low voltage PMOS transistors are turned ON, the output is pulled up to either the high voltage supply or the low voltage supply depending on a voltage of the high voltage supply and its relationship to a voltage of the low voltage supply.

In another general aspect, the disclosure describes a system including a high voltage supply that provides a high voltage (VDD_HV). The system also includes an internal voltage regulator that is coupled to the high voltage supply and that provides a low voltage (VDD_LV). VDD_LV is equal to a regulated voltage when VDD_HV is greater than the regulated voltage, and VDD_LV is equal to VDD_HV when VDD_HV is less than the regulated voltage. The system further includes a digital buffer circuit. The digital buffer circuit is configured to minimize a delay between an input and an output by upon receiving a logical high at the input pulling-up the output to VDD_HV using a HV PMOS transistor when VDD_HV is greater than the regulated voltage and pulling-up the output to VDD_LV using a LV PMOS transistor when VDD_HV is less than the regulated voltage.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

Like reference numerals designate corresponding parts throughout the several views.

DETAILED DESCRIPTION

The digital buffer circuit of the present disclosure advantageously accommodates a range of output voltages while reducing (or eliminating) a corresponding variation in speed over the range. In other words, the disclosed digital buffer circuit does not slow as the output voltage (VDD_HV) is reduced (i.e., from its maximum value).

Figure 1:
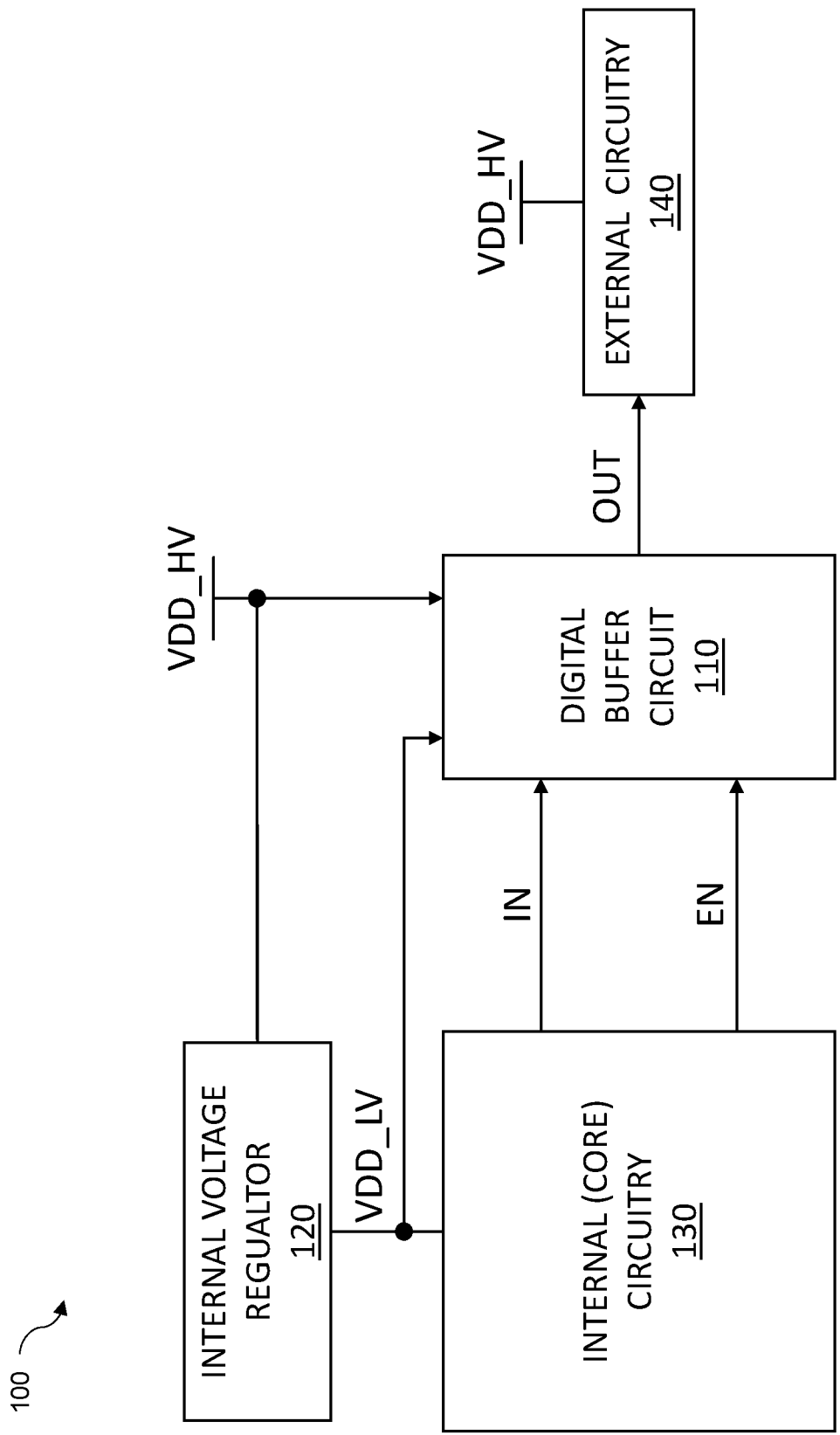
FIG. 1 is a block diagram of system that includes a digital buffer circuit according to an implementation of the present disclosure.

FIG. 1 is a block diagram of a system 100 using a digital buffer circuit 110 (i.e., buffer circuit) according to an implementation of the present disclosure. The digital buffer circuit 110 relates (i.e. translates) input digital signals in an input (i.e., internal, core) voltage domain to output digital signals in an output (i.e., external, bus) voltage domain. The input voltage domain may be defined by a power supply (i.e., supply) voltage that is between a reference (e.g., ground) voltage and an upper rail voltage (VDD_LV), and the output voltage domain may be defined by a supply voltage between the reference (e.g., ground (GND)) voltage and an upper rail VDD_HV voltage. VDD_LV may be fixed by an internal voltage regulator 120 (e.g. linear voltage regulator, voltage clamp) even as VDD_HV may vary. The digital buffer circuit 110 allows the internal core circuitry, operating a VDD_LV, to communicate with a variety of external circuitry 140 (e.g., an external bus) operating over a range of possible VDD_HV.

In one possible implementation the system 100 may include a core memory circuit (i.e., core memory) with digital and mixed-signal integrated circuits (ICs). For this implementation, the internal circuitry 130 is core logic that includes low voltage devices that cannot tolerate voltages above a maximum voltage below 2 volts (V) (e.g., 1.1 volts). The internal voltage regulator 120 ensures that the internal voltage does not rise above this maximum (low) voltage even when the external voltage (i.e., VDD_HV) does. The external circuitry 140 may be a communications bus (i.e., bus). To allow the core logic to communicate with various types of busses (e.g., having different VDD_HV) the digital buffer circuit 110 can be designed to accommodate a range of VDD_HV. For example, while the input voltage (i.e., VDD_LV) of the digital buffer circuit can be fixed at 1.1V the output voltage (i.e., VDD_HV) may vary from 1.1V to 5.6V.

In this disclosure, relative terminology (e.g., low/high) may be used to described voltages. A low voltage (LV) may be considered as a voltage corresponding to the input voltage domain (e.g., VDD_LV). A high voltage (HV) may be considered as a voltage corresponding to the output voltage domain (e.g., VDD_HV). Because the buffer circuit may be configured to provide a range of output voltages (VDD_HV), the terminology low voltage (LV) and high voltage (HV) may also be used to describe the state of VDD_HV in relationship to the input voltage (VDD_LV). Table 1 below clarifies the voltage domain relationships for a LV operating condition and a HV operating condition and the relationship to a regulated voltage (VREG), which can be considered as the boundary between a LV and a HV.

TABLE 1

| LV and HV Operating Conditions | | |
|---|---|---|
| | LV OPERATING CONDITION | HV OPERATING CONDITION |
| V. DOMAIN RELATIONSHIP | VDD_LV ≈ VDD_HV | VDD_LV < VDD_HV |
| RELATIONSHIP TO VREG | VDD_LV ≈ VDD_HV ≤ VREG | VDD_LV ≈ VREG < VDD_HV |

The terminology low voltage (LV) and high voltage (HV) may also be used to describe a device. A LV device, line, and/or terminal may be regarded as a device, line, and/or terminal having a voltage rating (i.e., low voltage rating) and/or dimensions suitable for (safe) operation with a voltage corresponding to the input (e.g., VDD_LV). A HV device, line, and/or terminal may be regarded as having a voltage rating (i.e., high voltage rating) and/or dimensions suitable for (safe) operation with a voltage corresponding to the (maximum) output voltage (e.g., VDD_HV). For the example implementation shown in TABLE 1, LV devices are rated for VREG (e.g., 2V). Accordingly, an internal voltage regulator 120 (see FIG. 1) can be used to ensure that the LV devices are supplied with a regulated voltage VREG (e.g., 2V) that is the maximum voltage (i.e., maximum LV) suitable for use with the LV devices. In a LV operating condition, VDD_HV is less than or equal to VREG (e.g., 2V) and the HV supply and the LV supply provide the same voltage (VDD_LV=VDD_HV) because the voltage regulator is not active. In this operating condition, it is as if only one supply is used. When VDD_HV is above VREG (e.g., 2V), however, VDD_LV remains regulated at VREG (e.g. 2V) by the internal voltage regulator. In this condition, HV devices are used and are supplied by VDD_HV (i.e., some voltage greater than 2V), while LV devices are supplied by VDD_LV (i.e., 2V).

HV transistors designed to switch high voltages/currents may be physically larger (e.g., larger channel dimensions) and may have larger switching capacitances than LV transistors designed to switch lower voltages/currents. Accordingly, the switching speed of the digital buffer circuit 110 may be slow, especially in a LV operating condition. For example, a digital buffer circuit with circuitry designed to drive an external bus 140 with a 5.6V upper rail voltage may operate slower when used to drive an external bus 140 with a 1.1V upper rail voltage. The slow speed may be even more severe for other applications. For example, an EEPROM process may have a core circuitry that utilizes 2V (low voltage) transistors, which are buffered to drive pad periphery having external circuitry utilizing 20V (high voltage) transistors. The digital buffer circuit of the present disclosure advantageously accommodates a range of output voltages while reducing (or eliminating) a corresponding variation in speed over the range. In other words, the disclosed digital buffer circuit does not slow as the output voltage (VDD_HV) is reduced (i.e., from its maximum value).

The switching speed of the digital buffer circuit corresponds to the rate of communication (i.e., data rate, speed, and bandwidth) that it can support. For example, an external communication bus may utilize a communication protocol with a data rate of 20 megabits per second (Mb/s)). Ideally, the digital buffer circuit passes the signals from its input (IN) to an output (OUT) with little (or no) distortion (e.g., delay) at all data rates. Practically, the digital buffer circuit may be limited by a delay between the input signal and the output signal. The delays may become more significant as data rates increase and limit a maximum communication rate.

Figure 2:
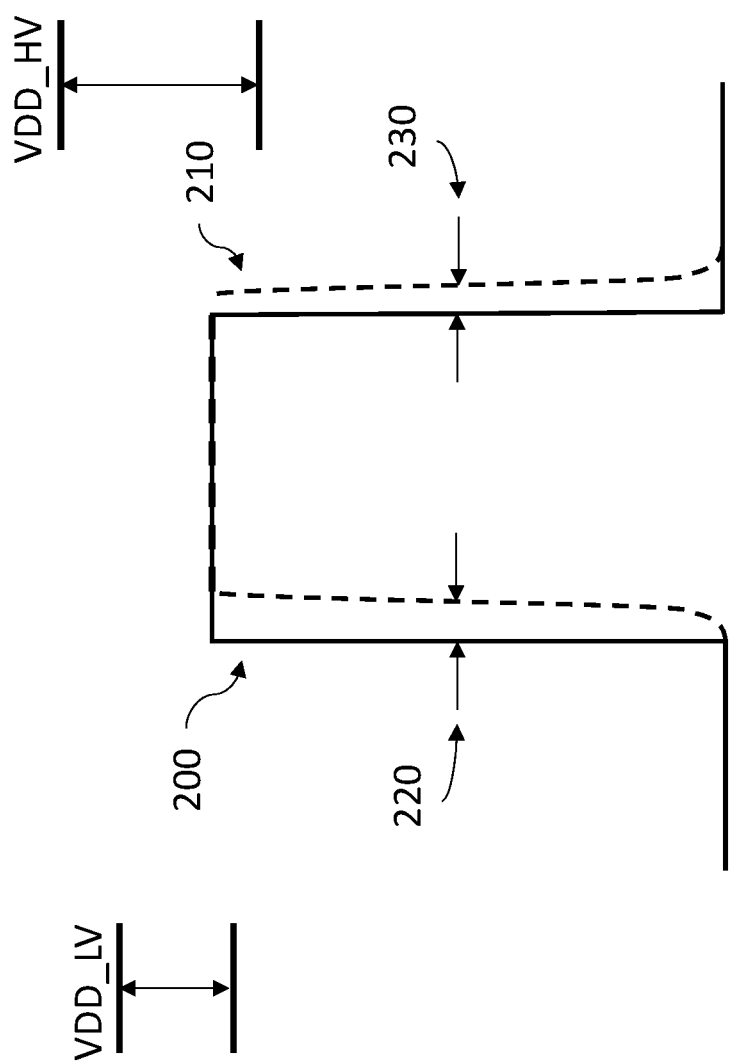
FIG. 2 shows an example input and output signals of a digital buffer circuit according to an implementation of the present disclosure.

FIG. 2 shows an example input and output signals of a digital buffer circuit according to an implementation of the present disclosure. The digital buffer circuit (i.e., buffer circuit, buffer) receives an input signal 200 in a voltage domain corresponding to VDD_LV and passes an output signal 210 in a voltage domain corresponding to VDD_HV. The output signal 210 can be a delayed version of the input signal with a first delay 220 between a rising edge of the input signal 200 and a rising edge of the output signal 210 and a second delay 230 between a falling edge of the input signal 200 and a falling edge of the output signal 210. The fidelity of digital communication may correspond to the size of the first delay and/or the second delay. Accordingly, a communication protocol (e.g., I3C, SPI) may stipulate a maximum delay acceptable for communication. Thus, a digital buffer circuit having a first delay and a second delay that are smaller than a specified value and as close to zero as possible may offer advantages for high speed communication. As mentioned previously, the speed of the buffer may correspond to the size of the switching devices and the voltages driving them. Accordingly, the speed of the buffer may be defined by a speed (e.g., 20 Mb/s) and a voltage range (e.g., ≥4 V) for which the delay of the buffer is below a specified value (e.g., less than about 10 nanoseconds).

Figure 3:
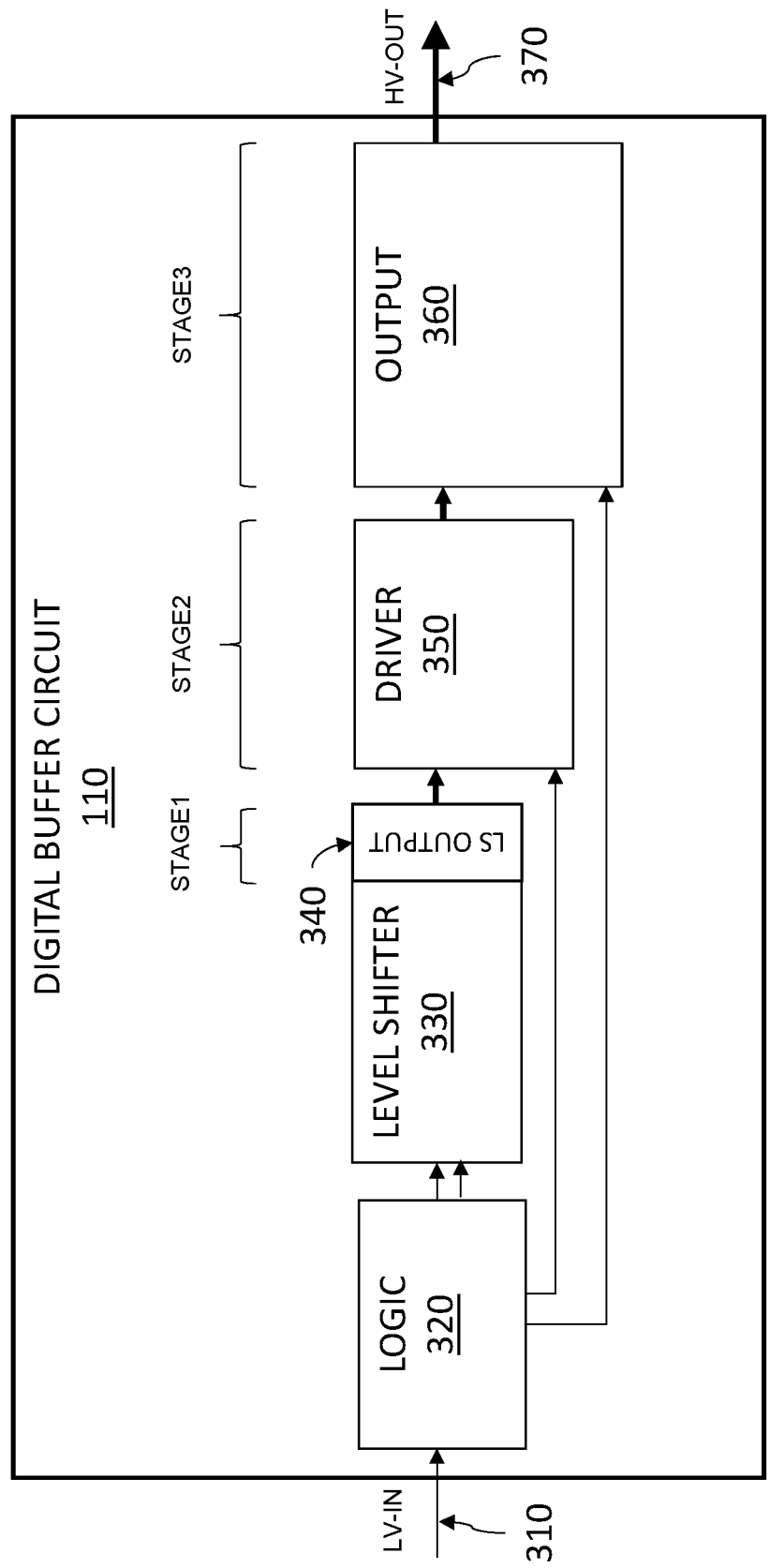
FIG. 3 is a block diagram of a digital buffer circuit according to an implementation of the present disclosure.

A block diagram of one possible implementation of the digital buffer circuit 110 is shown in FIG. 3. The buffer circuit 110 receives an input signal (LV-IN) at an input 310. The input signal (LV-IN) may be a relatively low voltage digital signal with a logical high corresponding to VDD_LV and a logical low corresponding to a ground voltage. In other words, the input signal can be in a low voltage (LV) domain and the output signal can be in a high voltage (HV) domain. In FIG. 3, portions of the circuit in the low voltage (LV) domain and portions of the circuit in the high voltage (HV) domain are indicated by the width of the line showing the flow of signals.

As shown in FIG. 3, the buffer circuit 110 can include a logic subcircuit 320 (i.e., logic). The logic includes logic gates, clocks, and timing circuits to enable the switching for the buffer circuit. In some implementations, the buffer circuit receives an enable signal (EN) (See FIG. 1). For these implementations, the logic 320 may enable/disable part, or all, of the functionality of the buffer circuit 110 based on the state (i.e., logical high, logical low) of the enable signal (EN). Additionally, the logic may condition the signals at the input into signals suitable for controlling a level shifter subcircuit 340. For example, the logic may create (e.g., generate) a pair of digital signals that include a first signal that is suitable for driving a P-channel switching device (e.g., to pull a voltage up) and a second signal that is suitable for driving an N-channel switching device (e.g., to push down a voltage down). In some embodiments, additional logic circuitry may be applied to the first signal and the second signal to prevent (or reduce) conditions in which the first signal and the second signal have logical states that could control the P-channel switching device and the N-channel switching device to conduct simultaneously, which could create a harmful condition (e.g., pull-up and push-down simultaneously) in the buffer circuit 110. In other words, the additional logic circuitry can be used to prevent overlapping states of the buffer.

As show in FIG. 3, the buffer circuit 110 can include a level shifter subcircuit 330 (i.e., level shifter). The level shifter 330 includes switching devices (e.g., transistors) and is connected to the supply of the HV domain. The switching devices may be controlled by the logical signals at the output of the logic 320 to connect the output of the level shifter subcircuit to a logical high in the HV domain (e.g., VDD_HV) or a logical low in the HV domain (e.g., ground) based on the LV digital signals at its input.

Figure 4:
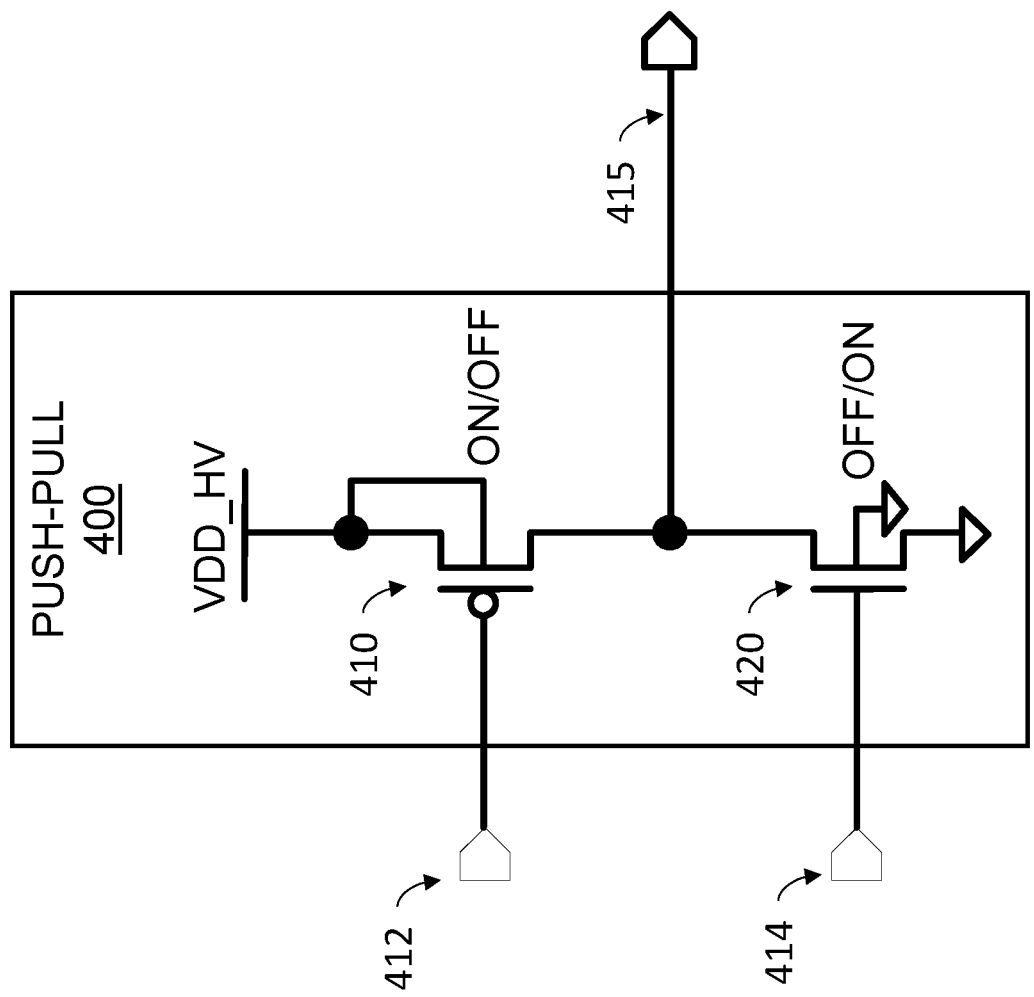
FIG. 4 is a schematic of a push-pull circuit.

The level shifter 330 may include a level-shifter (LS) output circuit (i.e., LS output) 340. FIG. 4 schematically depicts an implementation of the LS output 340 as push-pull circuit 400. The push-pull circuit (i.e., push-pull) 400 can include a P-channel metal oxide semiconductor (i.e., PMOS) transistor 410 coupled to an N-channel metal oxide semiconductor (i.e., NMOS) transistor 420. The transistors are series connected between the upper rail (e.g., VDD_HV) and a lower rail (i.e., ground) of the output voltage domain. The PMOS transistor 410 is connected to a first input 412, while the NMOS transistor 420 is connected to a second input 414. The output 415 of the push-pull circuit is the node between the series connected PMOS and NMOS transistors. In other words, the source terminal of the PMOS transistor may be connected to supply voltage VDD_HV, the drain terminal of the PMOS transistor may be connected to the output of the push-pull circuit, and the gate of the PMOS transistor may be connected to a first input of the push-pull circuit. Additionally the source terminal of the NMOS transistor may be connected to reference voltage (GND), the drain terminal of the NMOS transistor may be connected to the output of the push-pull circuit, and the gate of the NMOS transistor may be connected to a second input of the push-pull circuit.

In operation, digital signals may be provided (e.g., by logic 320) at the first input 412 and the second input 414. When the first input 412 is a logical low level (i.e., below VDD_HV by a threshold voltage) and the second input 414 is a logical low level (i.e., below a threshold voltage), the PMOS transistor conducts (i.e., is turned ON) and the NMOS transistor does not conduct (i.e., is turned OFF). In this state, the output 415 is pulled-up to approximately the upper rail voltage VDD_HV, which serves as the logical high for the output voltage domain (i.e., HV domain) of the circuit. When the first input 412 is a logical high level (i.e., at or above a threshold voltage below VDD_HV) and the second input 414 is a logical high level (i.e., above a threshold voltage), the PMOS transistor does not conduct (i.e., is turned OFF) and the NMOS transistor does conducts (i.e., is turned ON). In this state, the output 415 is pushed down to the ground voltage, which serves as the logical low for the output voltage domain (i.e., HV domain) of the circuit.

The size of the PMOS/NMOS transistors of the push-pull circuit may depend on the current level that is sourced or sunk during a push-pull operating. For example, when the required current is increased the size of the transistors may also increase. Switching large transistors quickly can be difficult without sufficient power to drive the gate of each transistor. Additionally, operating large transistors at a reduced VDD_HV may reduce the switching speed of the large transistor. For these reasons, additional stages may be used for the buffer circuit 110.

As shown in FIG. 3, a first (HV) stage (i.e., STAGE1) at the output of the level shifter (i.e., LS output 340) may be followed by a second, larger (HV) stage (i.e., STAGE2). The second stage is a driver circuit (i.e., driver 350) that operates much as the LS output 340 (i.e., in a push-pull fashion) including circuitry configured to drive more power (e.g., current) at the output. The driver 350 can reduce the drive requirements of LS output 340 while producing a larger drive signal to control a third, larger (HV) stage (i.e., STAGE3). The third stage is a buffer output 360 and can also operate in a push-push fashion to drive an output 370 (i.e., HV-OUT). While more or fewer stages may be used, the use of three stages (i.e., STAGE1, STAGE2, STAGE3), each of an increased size, may be a good balance, in some implementations, between low drive strength (i.e., too few stages) and high delay/complexity (i.e., too many stages).

In summary, the buffer circuit 110 implementation of FIG. 3 includes three stages with each stage performing a push-pull operation involving a pull-up or a push-down (i.e., pull down) of an output voltage using switching devices controlled by input voltages. While the functions of the stages may be the same, the size (e.g., device sizes) and strength (e.g., driving strength) may each may differ. In other words, each stage may provide successively high driver power at the output (i.e., to drive the next stage).

In addition to the use of a plurality of stages, the disclosed circuit and techniques provide a push-pull operation for each stage in a way that uses a combination of HV switching devices and LV switching devices to allow high speed buffering with high voltage handling capability. In other words, the digital buffer circuit can operate over a range of output voltages while maintaining a high speed. For example, the disclosed circuits and techniques may operate in with low output voltage (i.e., with respect to the input voltage) or a high output voltage (i.e., with respect to the input voltage) with little change in the delay between the input and the output signals of the buffer (i.e., with a significant reduction in speed).

The disclosed circuits and techniques utilize multiple stages. Each stage can include a combination of LV and HV switching devices so that the LV devices dominate the operation in a LV operating condition, while the HV devices dominate the operation in a HV operating condition. For example, a possible LV operating condition can be VDD_LV≈VDD_HV=1.1V and a possible HV operating condition can be VDD_LV=1.1V and VDD_HV=5.6V. Further, the disclosed circuits and techniques do not requiring any sensing of the voltage domains in order to determine a particular operating condition or how to apply LV or HV devices for the particular operating condition.

Figure 5:
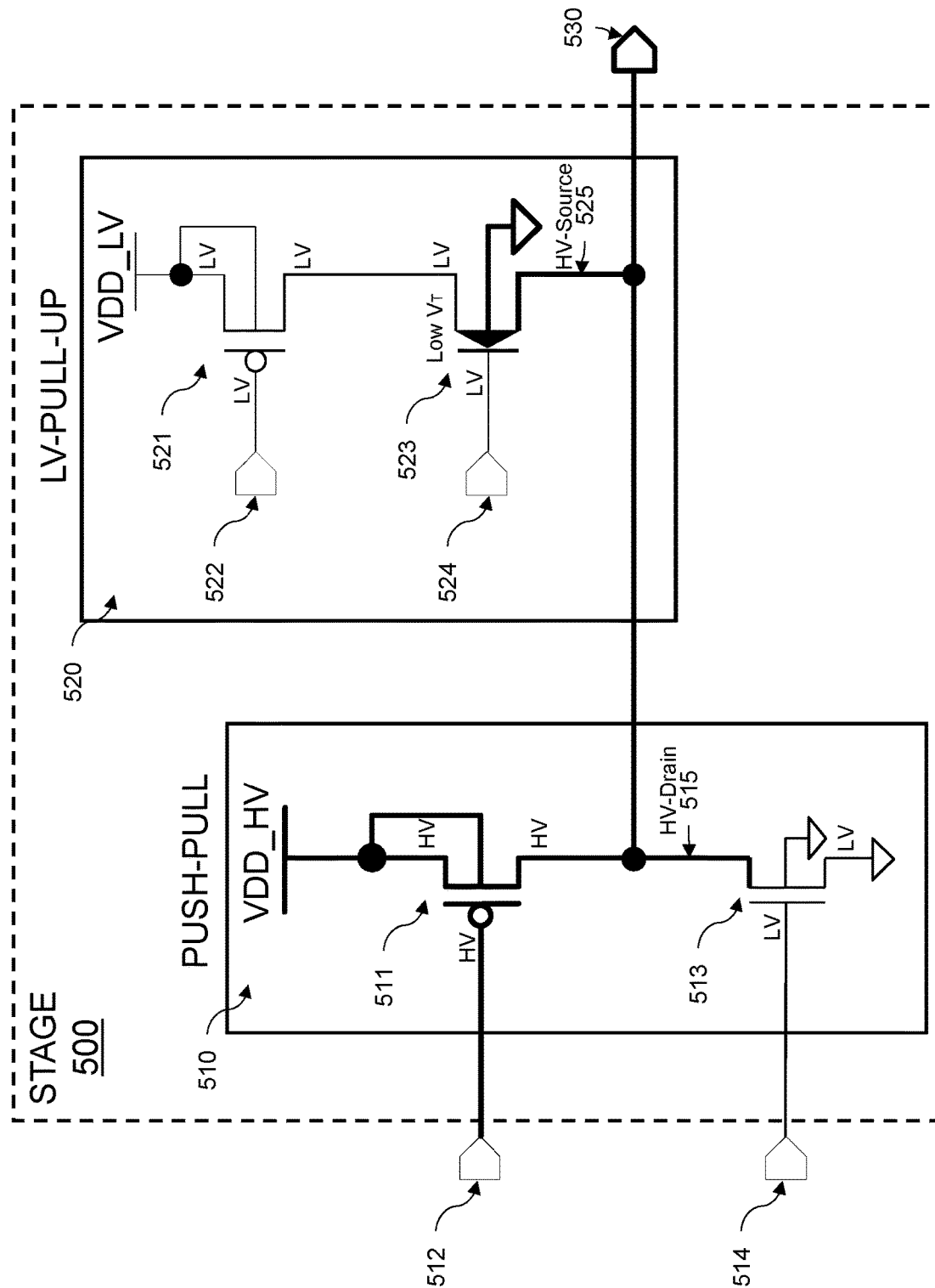
FIG. 5 is a schematic of a push-pull circuit and low voltage pull-up circuit for use in a digital buffer circuit according to an implementation of the present disclosure.

FIG. 5 is a schematic of a circuit implementation of a stage 500 for the digital buffer circuit of FIG. 3. The circuit topology of the stage 500 may be used for each of the multiple stages in the digital buffer circuit of FIG. 3 (e.g., STAGE1, STAGE2, and STAGE3). The stages in FIG. 3 may include switching devices (e.g., HV switching devices) of different (e.g., increasing size from STAGE1 to STAGE 3) size. The stage 500 shown in FIG. 5 includes HV portions/devices and LV portions/devices. The HV circuit portions/devices are illustrated with thicker lines than the LV circuit portions/devices. Additionally, nodes are indicated as either HV or LV.

As shown in FIG. 5, the stage 500 includes a push-pull circuit portion 510 that is controlled by a first push-pull input 512 and a second push-pull input 514 and powered by a HV supply voltage VDD_HV. The push-pull circuit portion 510 is coupled to the output 530 of the stage 500. Additionally, the stage 500 includes a low-voltage pull-up circuit portion (i.e., LV pull-up) 520 that is also coupled to the output 530. The LV pull-up is controlled by a first pull-up input 522 and a second pull-up input 524.

The push-pull circuit portion 510, includes an LV NMOS transistor fabricated with a process technology (e.g., ONC18EE, nonvolatile memory technology) that includes features (e.g., thin oxide layer) to allow the LV NMOS transistor 513 to be controlled at a gate terminal (i.e., push-pull input 514) with a LV signal to switch a HV signal at a drain (and source) terminal (i.e., coupled to the output 530). In other words, the HV drain terminal 515 of the LV NMOS 513 can withstand (i.e., tolerant) high voltage, while the gate terminal (i.e., second push pull input 514) is rated for low voltage, which allows the LV NMOS transistor to be switched ON/OFF quickly. The LV NMOS 513 with HV drain terminal 515 is smaller (e.g., has smaller switching capacitances) than a HV NMOS. Accordingly, the LV NMOS 513 with HV drain 515 allows the push-pull circuit portion 510 to pull down the output 530 to a logical low faster than a HV NMOS with a HV gate. The stage 500 can perform the pull-down in any operating condition (see TABLE 1) using the LV NMOS 513 with HV drain 515.

The push-pull circuit portion 510 also includes a high voltage PMOS transistor (i.e., HV PMOS) 511. The HV PMOS 511 can be controlled by HV signals because of the switching relationship between the operation of the PMOS transistor and the HV supply (VDD_HV). For example, to turn the HV PMOS OFF, the voltage applied to the gate terminal (i.e., the first push pull input 512) can be approximately VDD_HV (i.e., VDD_HV−VT). When the HV supply voltage is large (i.e., VDD_HV>VDD_LV) then the pull-up operation of the stage 500 is provided by the HV PMOS 511. Because the HV PMOS is operating in a HV condition, the switching speed is relatively fast. When the HV supply voltage is small (i.e., VDD_HV VDD_LV) then the speed of the HV PMOS is slower. In this operating condition, the pull-up operation can be performed more quickly by an (auxiliary) LV pull-up 520.

The voltage pull-up of the output 530 in a low voltage (i.e., VDD_HV≈VDD_LV) operating condition is performed by the LV pull-up circuit portion (i.e., LV pull-up) 520. The LV pull-up includes a low voltage PMOS transistor 521 (i.e., LV PMOS) that can be controlled by a low voltage signal at a gate terminal 522 to pull the output 530 of the HV-stage to a supply rail VDD_LV. The LV PMOS transistor 521 may be switched much faster than the HV PMOS transistor in the low voltage operating condition. Accordingly, the speed of the pull-up operation is not slowed even in a low voltage operating condition.

The LV pull-up 520 also includes a low-voltage, low-threshold NMOS transistor (i.e. low threshold NMOS) 523 that is controlled by a LV signal at a gate terminal 524 to turn ON when the LV PMOS is turned ON. The output 530 is pulled up through the low threshold NMOS and the LV PMOS 521. The low (i.e. as compared to 0.7 V) threshold of the low threshold NMOS 523 reduces the voltage drop across the device so that the output 530 may be pulled closer to VDD_LV. In a LV operating condition (i.e., VDD_LV≈VDD_HV), the LV PMOS 521 can be turned ON faster than the HV PMOS 511 can be turned ON. Accordingly, the contribution of the HV PMOS 511 in pulling up the output 530 is reduced or eliminated.

The low-voltage, low-threshold NMOS transistor 523 (i.e., low threshold NMOS) includes a HV tolerant source terminal (i.e., HV source terminal 525) that can be controlled to resist current (i.e. turned OFF) by a voltage between a gate terminal 524 and the HV source terminal 525 (i.e., coupled to the output 530). This low-voltage NMOS transistor with a HV source prevents (and/or reduces) coupling between the high voltage rail VDD_HV and the low voltage rail VDD_LV in a high voltage (i.e., VDD_HV>VDD_LV) operation condition. In the HV operating condition (i.e., VDD_LV<VDD_HV), the HV PMOS 511 is driven ON to pull up the output 530 to VDD_HV. At approximately the same time (i.e., because there is no power supply sensing) the LV PMOS 521 is driven ON. The switching speeds of the HV PMOS transistor and the LV PMOS transistor are approximately the same in the HV condition. Accordingly, low voltage low threshold NMOS transistor 523 is turned OFF by a negative gate-source voltage. Thus, the NMOS transistor is used to decouple the LV pull up 520 circuit portions for HV operating conditions.

The disclosed circuits and techniques describe using multiple stages (i.e., HV stages) to increase the speed of each stage while keeping the overall driving capability the same. In another aspect, the disclosed circuits and techniques described a push-pull circuit portion for each stage that utilizes a low voltage NMOS transistor with a drain that tolerates high voltages (i.e., a HV-tolerant drain) for pulling down an output voltage to ground when controlled by a low voltage input signal at its gate. In another aspect, the disclosed circuits and techniques an LV pull-up circuit portion for pulling up the output of the stage to VDD_LV in a LV operating condition. In another aspect the disclosed circuits and techniques describe using a low voltage low threshold NMOS transistor to decoupled the LV pull-up circuit portion from the output of the stage in a HV operating condition, and to allow the circuit to use HV devices in a HV operating condition and LV switching devices in a LV operating condition with no sensing (e.g., active sensing) of the operating condition.

Figure 6:
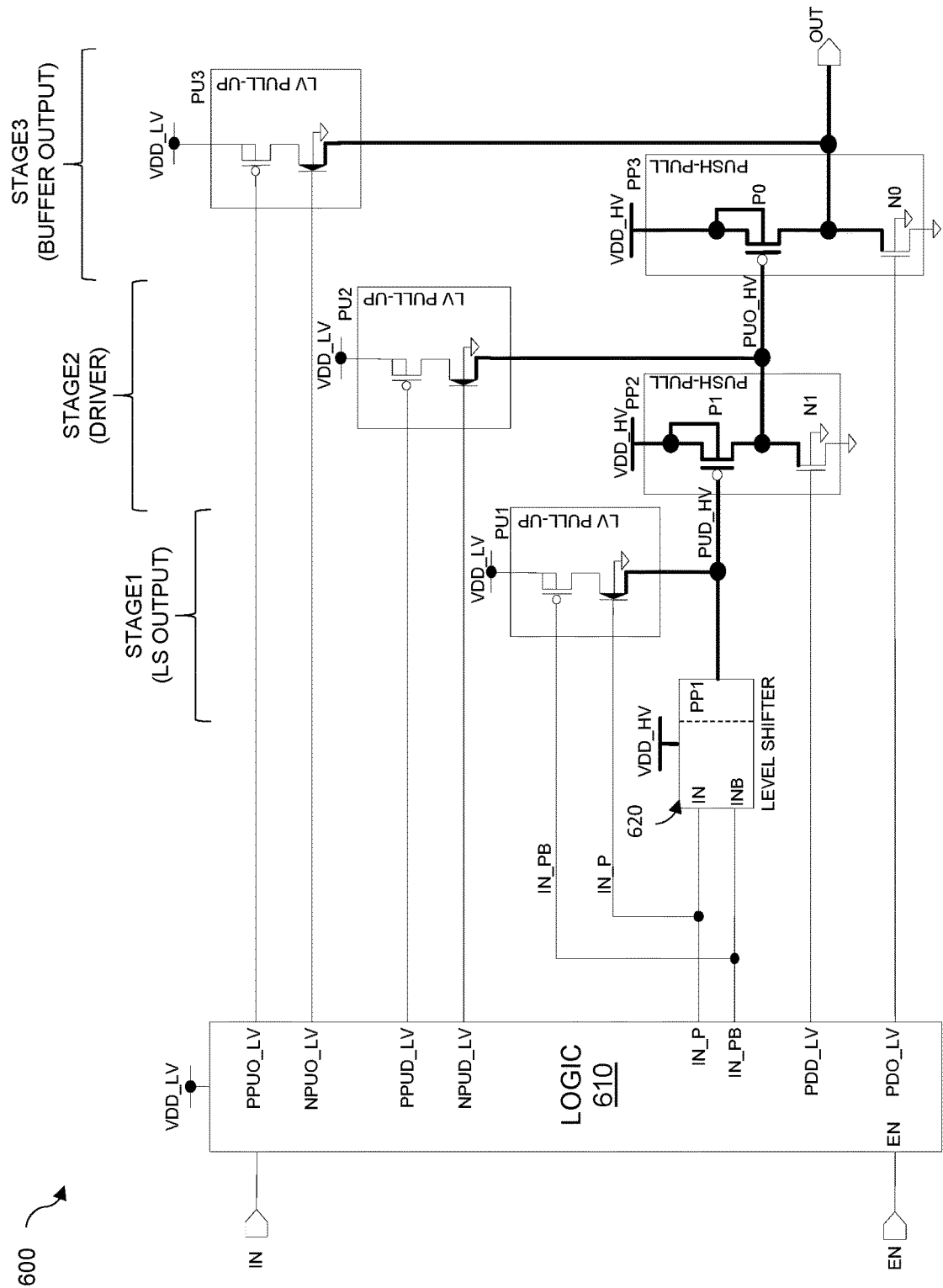
FIG. 6 is a schematic of the digital buffer circuit according to an implementation of the present disclosure.

A schematic of an implementation of the digital buffer circuit is shown in FIG. 6. The schematic illustrates portions of the circuit corresponding to the three stages (i.e., STAGE1, STAGE2, and STAGE3). Each stage includes a push-pull circuit (i.e., PP1, PP2, and PP3 respectively) and an LV pull-up circuit (i.e., PU1, PU2, and PU3 respectively). The push-pull circuit of the first stage (i.e., PP1) is not shown in detail because it is part of the level shifter. Each stage includes the push-pull circuit portion and LV circuit portion operate as described for the example stage shown in FIG. 5. In FIG. 6, the HV circuits and devices are indicated by lines that are thicker than used for the LV circuits and devices. The digital buffer circuit is supplied by a low voltage supply (VDD_LV) and a high voltage supply (VDD_HV), which based on their respective values describe an operating condition of the digital buffer circuit 600. The digital buffer circuit 600 receives a digital signal with logical values corresponding to a first supply domain (e.g., VDD_LV) at an input (IN) and drives a corresponding output digital signal with logical values corresponding to a second supply domain (e.g., VDD_HV at an output (OUT).

The digital buffer circuit 600 includes a logic circuit (i.e., logic) 610. The logic receives a digital enable signal (EN). The state (i.e., logical high/low) of the enable signal causes the logic to disable operation of all or part of the digital buffer circuit when disabled. When enabled the digital, the logic 610 also receives a digital input signal and based on the digital input signal produces control signals for the various circuitry in the buffer circuit. For example, the logic may produce a low voltage signal pair (i.e., IN_P, IN_PB) corresponding to the input signal for input to the level shifter 620. These signals may also control the switching devices of the LV pull-up PU1 to be (simultaneously) ON or OFF. Additionally, the logic 610 may create a signal pair (i.e., PPUD_LV, NPUD_LV) to control the switching devices of the LV pull-up (PU2) of the driver stage (STAGE2) to be (simultaneously) ON or OFF. Additionally, the logic 610 may create a signal pair (i.e., PPUD_LV, NPUD_LV) to control the switching devices of the LV pull-up (PU3) of the output stage (i.e., STAGE3) to be (simultaneously) ON or OFF. The logic 610 may also produce a signal (PDD_LV) to control a pull-down switching device for the push-pull stage (i.e., PP2) of the driver stage (i.e. STAGE2). The logic 610 may also produce a signal (i.e., PDO_LV) to control the pull-down switching device for the push-pull stage (i.e., PP3) of the output stage (i.e., STAGE3). The respective signals may be timed based on the input signal so that there are no overlapping conditions between the states of the switching devices. Accordingly, the logic circuit may include a logic gates and timing to perform a non-overlapping operation.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A buffer circuit, the buffer circuit comprising:
a plurality of stages each coupled to a high voltage (HV) supply and a low voltage (LV) supply, wherein each stage includes:
a push-pull circuit that includes a HV PMOS transistor controllable to pull-up an output of the stage to the HV supply when the buffer circuit is in a HV operating condition; and
an LV pull-up circuit that includes an LV PMOS transistor controllable to pull-up the output of the stage to the LV supply when the buffer circuit is in an LV operating condition, wherein in the HV operating condition, the LV supply is decoupled from the HV supply by a LV NMOS transistor that has a HV source terminal coupled to the output of the stage.

2. The buffer circuit according to claim 1, wherein:
the LV PMOS is controllable to pull-up the output faster than the HV PMOS in the LV operating condition, and
the HV PMOS is controllable to pull up the output as fast as the LV PMOS in the HV operating condition.

3. The buffer circuit according to claim 1, wherein:
in the HV operating condition, the LV supply provides a regulated voltage and the HV supply provides a voltage that is higher than the regulated voltage; and
in the LV operating condition, the LV supply and the HV supply both provide a voltage that is lower than the regulated voltage.

4. The buffer circuit according to claim 3, wherein the regulated voltage corresponds to a voltage rating of the LV PMOS.

5. The buffer circuit according to claim 1, wherein the push-pull circuit of each stage further includes:
an LV NMOS transistor coupled to the HV PMOS transistor and the output by a HV drain terminal; and
the LV NMOS transistor controllable, by a LV signal at a gate terminal, to pull-down the output to a ground voltage when the buffer circuit is in either the HV operating condition or the LV operating condition.

6. The buffer circuit according to claim 1, wherein the LV pull-up circuit of each stage includes:
an LV NMOS transistor coupled to the LV PMOS transistor and the output by a HV source terminal; and
the LV NMOS transistor controllable, by an LV signal at a gate terminal, to decouple the LV PMOS transistor from the output in the HV operating condition.

7. The buffer circuit according to claim 6, wherein the LV NMOS transistor has a threshold voltage lower than 0.7 volts.

8. The buffer circuit according to claim 1, wherein the plurality of stages are series connected, each stage providing a successively higher drive power at the output.

9. A method for buffering a digital signal, the method comprising:
upon receiving a logical high signal, controlling a low voltage NMOS transistor that is coupled between an output and ground to turn ON so that an output is pulled-down to a ground; and
upon receiving a logical low signal, controlling a high voltage PMOS transistor that is coupled between a high voltage supply and the output to turn ON and controlling a low voltage PMOS transistor that is coupled between a low voltage supply and the output to turn ON so that the output is pulled-up to either the high voltage supply or the low voltage supply depending on respective switching speeds of the high voltage PMOS and the low voltage PMOS, which are determined by a voltage of the high voltage supply and a relationship between the voltage of the high voltage supply and a voltage of the low voltage supply.

10. The method according to claim 9, wherein the output is pulled up to the high voltage supply when the voltage of the high voltage supply is greater than a regulated voltage and the voltage of the low voltage supply is equal to the regulated voltage.

11. The method according to claim 9, wherein the output is pulled up to the low voltage supply when the voltage of the high voltage supply is less than a regulated voltage and the voltage of the low voltage supply is equal to the high voltage supply.

12. A system comprising:
a high voltage supply providing a high voltage (VDD_HV);
an internal voltage regulator coupled to the high voltage supply and providing a low voltage (VDD_LV), VDD_LV equal to a regulated voltage when VDD_HV is greater than the regulated voltage and VDD_LV equal to VDD_HV when VDD_HV is less than the regulated voltage;
a digital buffer circuit configured to reduce a delay between an input and an output by, upon receiving a logical high at the input:
  pulling-up the output to VDD_HV using a HV PMOS transistor when VDD_HV is greater than the regulated voltage; and
  pulling-up the output to VDD_LV using a LV PMOS transistor when VDD_HV is less than the regulated voltage.

13. The system according to claim 12, wherein the digital buffer circuit is further configured to minimize a delay between the input and the output by, upon receiving a logical low at the input:
  pulling down the output to ground using a LV NMOS transistor with a high voltage drain.

14. The system according to claim 12, wherein the HV PMOS transistor is prevented from pulling up the output by the LV PMOS transistor when VDD_HV is less than the regulated voltage because the LV PMOS transistor pulls up the output before the HV PMOS can turn ON.

15. The system according to claim 12, wherein the LV PMOS transistor is prevented from pulling up the output by a low-voltage, low-threshold NMOS transistor that decouples the LV PMOS transistor from the output when the output is pulled up to VDD_HV and VDD_HV is larger than VDD_LV.

16. The system according to claim 12, wherein the digital buffer circuit includes a plurality of series connected stages, each stage likewise configured to minimize a delay between an input and an output, and each stage having successively larger LV PMOS and HV PMOS transistors to drive more power at the output.

17. The system according to claim 12, further comprising a level shifter.

18. The system according to claim 17, further comprising logic configured to receive an input signal and produce signals to control the level shifter, the logic including circuitry to prevent overlapping states in the level shifter.

19. The system according to claim 12, further comprising a bus connected to the output of the digital buffer circuit and a core memory connected to the input of the digital buffer circuit.

20. The system according to claim 12, wherein VDD_HV is in a range of 1.2 to 5.6 volts, VDD_LV is in a range of 1.2 to 2.0 volts, and the regulated voltage is 2 volts.

* * * * *